United States Patent
Pagnanelli

(10) Patent No.: US 9,715,914 B1
(45) Date of Patent: Jul. 25, 2017

(54) POLYPHASE BUFFER FOR RATE-CONVERSION

(71) Applicant: Syntropy Systems, LLC, Huntington Beach, CA (US)

(72) Inventor: Christopher Pagnanelli, Huntington Beach, CA (US)

(73) Assignee: Syntropy Systems, LLC, Huntington Beach, CA (US)

( * ) Notice: Subject to any disclaimer, the term of this patent is extended or adjusted under 35 U.S.C. 154(b) by 0 days.

(21) Appl. No.: 15/259,161

(22) Filed: Sep. 8, 2016

Related U.S. Application Data

(60) Provisional application No. 62/233,332, filed on Sep. 26, 2015.

(51) Int. Cl.
    *G11C 7/22* (2006.01)
(52) U.S. Cl.
    CPC .................................. *G11C 7/222* (2013.01)
(58) Field of Classification Search
    USPC ............... 365/233.1; 327/144, 235; 711/169
    See application file for complete search history.

(56) References Cited

U.S. PATENT DOCUMENTS

| | | | |
|---|---|---|---|
| 3,093,815 A | 6/1963 | Kamaugh | |
| 4,002,844 A | 1/1977 | Doussoux | |
| 4,171,538 A | 10/1979 | Sheller | |
| 5,583,894 A | 12/1996 | Linsley | |
| 5,598,113 A * | 1/1997 | Jex | G06F 5/06 326/94 |
| 5,909,563 A * | 6/1999 | Jacobs | G06F 9/30141 375/354 |
| 6,055,285 A * | 4/2000 | Alston | H04J 3/062 375/356 |
| 6,167,495 A * | 12/2000 | Keeth | G11C 7/20 711/105 |
| 6,243,841 B1 * | 6/2001 | Mydill | G01R 31/31919 324/73.1 |
| 6,452,865 B1 * | 9/2002 | Wolford | G11C 7/106 365/189.05 |
| 6,549,051 B1 * | 4/2003 | Di Veroli | H03H 17/0009 327/158 |
| 6,900,665 B2 * | 5/2005 | Ma | H04L 7/02 326/94 |
| 7,287,105 B1 * | 10/2007 | Owen | G06F 1/12 365/189.08 |
| 7,333,516 B1 * | 2/2008 | Sikkink | H04L 7/0012 370/503 |

(Continued)

OTHER PUBLICATIONS

Bregni, Stefano. "A historical perspective on telecommunications network synchronization." IEEE Communications Magazine 36.6 (1998): 158-166.

(Continued)

*Primary Examiner* — Vu Le
*Assistant Examiner* — Sung Cho
(74) *Attorney, Agent, or Firm* — Joseph G. Swan, P.C.

(57) ABSTRACT

Provided are, among other things, systems, apparatuses methods and techniques for changing the sampling rate of a discrete-time signal. One such apparatus includes a plurality of parallel processing paths, with each path comprising multiple storage banks and multiplexing elements that operate at a subsampling rate.

17 Claims, 8 Drawing Sheets

(56) References Cited

U.S. PATENT DOCUMENTS

| | | | | | |
|---|---|---|---|---|---|
| 7,363,526 | B1* | 4/2008 | Chong | ............ | G06F 5/06 713/400 |
| 7,366,207 | B1* | 4/2008 | Vaishnav | ............ | H04J 3/062 370/509 |
| 7,515,664 | B1* | 4/2009 | Yeoh | ............ | H04L 7/0083 327/141 |
| 7,685,482 | B2* | 3/2010 | Warren | ............ | G01R 31/31853 324/750.3 |
| 7,813,459 | B2* | 10/2010 | Hasan | ............ | H04L 7/0012 375/354 |
| 8,127,050 | B1* | 2/2012 | Tremblay | ............ | G06F 13/423 710/12 |
| 8,468,381 | B2* | 6/2013 | Jones | ............ | H04L 49/109 375/354 |
| 8,527,676 | B2* | 9/2013 | Morrison | ............ | G11C 7/1012 709/234 |
| 8,578,074 | B2* | 11/2013 | Tung | ............ | G06F 1/12 326/96 |
| 2004/0028164 | A1* | 2/2004 | Jiang | ............ | H04L 12/46 375/371 |
| 2004/0251932 | A1* | 12/2004 | Ma | ............ | H04L 7/02 326/94 |
| 2006/0098770 | A1* | 5/2006 | Harper | ............ | H04L 7/0012 375/356 |
| 2007/0076830 | A1* | 4/2007 | Hasan | ............ | H04L 7/0012 375/354 |
| 2007/0177698 | A1* | 8/2007 | Pawar | ............ | H04L 7/00 375/354 |
| 2007/0201592 | A1* | 8/2007 | Maiyuran | ............ | G06F 5/065 375/372 |
| 2009/0153194 | A1* | 6/2009 | Cumming | ............ | H03K 5/15066 326/93 |
| 2013/0028313 | A1* | 1/2013 | Shen | ............ | H04L 25/03057 375/233 |
| 2015/0364170 | A1* | 12/2015 | Clovis | ............ | G06F 13/4291 365/189.02 |

OTHER PUBLICATIONS

Ginosar, Ran. "Metastability and synchronizers: A tutorial." IEEE Design and Test of Computers 28.5 (2011): 23-35.

F. J. Witt, "An Experimental 224 Mb/s Digital Multiplexer-Demultiplexer Using Pulse Stuffing Synchronization", The Bell System Technical Journal, vol. 44, Issue 9 (1965), pp. 1843-1885.

* cited by examiner

POLYPHASE BUFFER FOR RATE-CONVERSION

FIELD OF THE INVENTION

The present invention pertains to systems, apparatuses, methods and techniques for changing the sampling rate of a discrete-time signal, and it is particularly applicable to clock domain crossing and rate-conversion at very high sampling frequencies.

BACKGROUND

As high-speed digital (discrete-time) systems come to rely more on distributed processing techniques, the reliable transfer (crossing) of data samples from one clock domain to another clock domain becomes increasingly critical. Multiple clock domains arise in digital systems when differences in sampling clock sources, which are intentional (e.g., different input/output frequencies) or unintentional (e.g., latencies, timing skews, jitter, etc.), cause various processing operations to take place at different rates and/or at uncertain time intervals. The asynchronous data transfers associated with clock domain crossing (CDC), where data samples are generated (i.e., by a transmitting register) in one clock domain and sampled (i.e., by a receiving register) in another clock domain, are subject to errors when a transition from one data sample to the next happens at or near the sampling instant of the receiving register. For reliable transfer to a receiving register, a data sample must maintain a constant (stable) value for a short period of time prior to sampling (i.e., a required setup time must be met), and a data sample must maintain a constant (stable) value for a short period of time subsequent to sampling (i.e., a required hold time must be met). If either a required setup time or a required hold time is violated, the receiving (sampling) register can enter what conventionally is referred to as a metastable state, in which the digital outputs of the register float in an invalid state for a while, before eventually settling into a random state. Metastability is a particular concern is digital processing systems, because not only do transitions between data samples take an increased amount of time (i.e., increased latency), but the transitions result in data samples having an unpredictable value. Certain techniques and apparatuses are conventionally utilized to minimize or prevent metastability errors in asynchronous data transfers between clock domains. These techniques and apparatuses include cascaded flip-flops, handshaking first-in first-out (FIFO) memories, and dual-port FIFO memories. Because the operating frequency of these conventional techniques is limited, however, a need exists for improved methods of clock domain crossing and rate-conversion.

When the various elements of a digital system/network operate at the same sampling rate, but separate clock domains result from uncertainties in sampling instants (e.g., uncertainties in sampling phase such as those caused by latencies, timing skews, jitter, etc.), such a system conventionally is referred to as being mesochronous. Elastic buffers typically are placed at various data transfer locations (i.e., data interfaces) in mesochronous systems, to absorb the differences between an actual (instantaneous) sampling rate and an average sampling rate. FIG. 1 gives a block diagram of a basic elastic buffer (e.g., buffer 10A), which conventionally is utilized to absorb any random, zero-mean fluctuations between the rate of data sample transmission in one clock domain (i.e., a write clock domain established by $W_{CLK}$ on line 3A) and the rate of data sample reception in a second clock domain (i.e., a read clock domain established by $R_{CLK}$ on line 4A). Under the control of the enable lines (e.g., lines 6A-C) from write counter 7A, which is typically implemented as a conventional ring counter, input data samples received on line 1A are sequentially written into registers 5A-C. Then under the control of select line 8 from read counter 7B, output data samples are coupled onto output line 2A via conventional multiplexer 9, which is configured on each read cycle, to select the oldest sample from the register bank created by registers 5A-C. Retrieving the oldest sample from the register bank minimizes the chance of having a simultaneous read and write operation to the same register.

Additionally, the transfer of data samples across two separate clock domains often is synchronized using first-in, first-out (FIFO) memory structures, such as those similar to circuit 10B of FIG. 2. Conventional FIFO circuit 10B uses a dual-port, random-access memory (e.g., dual-port RAM 15) so that one port can be used to write (store) a data sample into a memory location (address), while a second port is used to read (retrieve) a data sample from a different memory location. Write operations occur on intervals defined by output 3B ($W_{CLK}$) of write clock oscillator 13A, and read operations occur on potentially different intervals defined by output 4B ($R_{CLK}$) of read clock oscillator 13B. The output of write address counter 12A determines the memory address that is accessed during a write operation, and the output of read address counter 12B determines the memory address that is accessed during a read operation. Conventionally, potential conflicts between write and read access are avoided by creating a lag (offset) between the outputs of write and read address counters, so that write access to a particular memory location occurs in advance of read access to that same memory location (i.e., write operations occur ahead of read operations). Synchronizers like FIFO circuit 10B, however, can experience problems with metastability in plesiochronous systems, where the different elements of the system operate at nearly the same sampling rate, but do not operate at exactly the same sampling rate (i.e., the transfer of data samples between clock domains is almost, but not perfectly synchronous). More specifically, if write operations take place less frequently than read operations, eventually an attempt will be made to read from a location of memory that has yet to be written (i.e., write address counter 12A falls behind read address counter 12B). Conversely, if write operations take place more frequently than read operations, eventually an attempt will be made to write to a location of memory that has yet to be read (i.e., the write address counter overtakes the read address counter). At a sampling instant when either the write address counter or the read address counter is overtaken by the other, metastability errors can result when a write operation and a read operation occur to the same memory location at the same time.

One of the conventional methods used to overcome metastability errors in plesiochronous systems is synchronizer circuit 20A, shown in FIG. 3A. A primary difference between FIFO circuit 10B and synchronizer circuit 20A, is that the FIFO depth is monitored and used to adjust the rate of read access. Via line 15A, depth indicator 19A calculates the difference (i.e., depth) between the value at the output of a write address counter and the value at the output of a read address counter, both of which are internal to FIFO circuit 17 (e.g., internal write and read address counters perform the same function as external write address counter 12A and external read address counter 12B in FIG. 2). Before the depth of FIFO circuit 17 reaches a value of zero, which would indicate that the write and read address counters are overlapping (i.e., the write address location is equal to the read address location), the frequency of tunable oscillator 13C is adjusted via line 15B, to advance the read address counter (e.g., by increasing the frequency on clock line 4C), or to retard the read address counter (e.g., by decreasing the frequency on clock line 4C). Conventionally, the FIFO depth is maintained at a level which can accommodate the expected variations in the phase (i.e., instantaneous frequency) of the write clock on line 3C. As shown in FIG. 3A, synchronizer 20A also includes a clock recovery function (e.g., circuit 18), which extracts a write clock on line 3C from the incoming data samples on line 1C. If the incoming data samples (e.g., the data samples on line 1C) transition to new values on irregular intervals, this clock recovery function can mitigate potential metastability errors from occurring at input register 14A. In conventional systems, where the incoming data samples transition to new values on regular (consistent) intervals, this feature typically is absent.

Another conventional method used to overcome metastability errors in plesiochronous systems is synchronizer circuit 20B, shown in FIG. 3B. Rather than adjusting the frequency of a read clock oscillator, synchronizer 20B uses a technique that is conventionally referred to as pulse stuffing (or bit stuffing), in which data samples are replicated or deleted in a predicable manner to prevent the internal write and read address counters of FIFO 17 from overlapping. More specifically, if write operations take place less frequently than read operations, a particular data sample will be read from memory twice (i.e., data sample repetition occurs when the write address counter starts falling behind the read address counter). Conversely, if write operations take place more frequently than read operations, a particular data sample is skipped over and not read (i.e., data sample deletion occurs when the write address counter starts moving ahead of the read address counter). Before the depth of FIFO 17 reaches a value of zero, which would indicate that the write and read address counters are overlapping, depth indicator 19B in conjunction with pulse modulator 16, adds or deletes pulses from the read cycle clock 4D. When a pulse is deleted from read cycle clock 4D, via control line 15C, the read address counter effectively is retarded relative to the write address counter (i.e., and relative to output data clock 4E), and a data sample is read from the current memory location a second time. When a pulse is added to read cycle clock 4D, via control line 15C, the read address counter is advanced relative to the write address counter (i.e., and relative to output data clock 4E), and a data sample is not read from the current memory location. Conventionally, the FIFO depth is maintained at a level which can accommodate the expected variations in the phase (i.e., instantaneous frequency) of the write clock on line 3C. To avoid altering the content of a data transmission (e.g., altering through the replication or deletion of data samples), special data samples are sometimes inserted into the transmission stream at strategic locations (e.g., locations defined by frame boundaries). At these strategic locations, the special data samples are replicated or deleted as necessary for synchronization, and then are subsequently removed from the transmission stream by processors able to recognize these special data samples.

Since the first use of elastic buffers for clock domain crossing and synchronization (i.e., rate-conversion), advances in the prior art have primarily addressed methods for preventing simultaneous write and read access to the same memory location (i.e., the advances have addressed the issue of buffer metastability). These advances include: 1) U.S. Pat. No. 3,093,815 which was issued in 1963, and discloses a means for monitoring buffer depth to adjust a receive data clock; 2) U.S. Pat. No. 4,002,844 which was issued in 1977, and discloses a means for inserting data samples (i.e., justification bits) to synchronize a system (i.e., a multiplexing system) having multiple clock domains; 3) U.S. Pat. No. 4,172,538 which was issued in 1979, and discloses a means for multiplexing the outputs of write/read address counters to prevent simultaneous reading and writing of the same storage location; 4) U.S. Pat. No. 5,583,894 which was issued in 1996, and discloses a means for dynamically adjusting read/write address counters so that potential overlaps (slips) occur at frame boundaries; and 5) U.S. Pat. No. 7,366,207 which was issued in 2008, and discloses a means for disabling the dynamic adjustment of read/write address counters during periods when data samples transition to new values at uncertain times (i.e., transition during periods of high jitter). The present inventor has not identified any advances in elastic buffering methods and apparatuses have addressed a means for increasing the sampling rates at which rate-conversion buffers are able to operate (e.g., the rate/frequency at which data samples can be transferred across clock domains). More specifically, the conventional multirate processing techniques that have been utilized in linear systems to distribute processing operations across multiple parallel paths apparently have not been adapted for use in clock domain crossing applications.

Conventional methods for multirate processing have been utilized in the implementation of linear circuits, including transversal (i.e., finite-impulse-response) and recursive (i.e., infinite-impulse-response) filter structures. In a conventional multirate system, a processing operation is decomposed (e.g., via polyphase decomposition) into multiple parallel processing paths. In effect, each of the parallel paths operates at a reduced sampling rate (i.e., a sub-rate), and generates the subset of data samples that would be obtained if the complete (i.e., full-rate) set of data samples were to be subsampled at a particular sample-time offset (i.e., at a particular subsampling phase). Thereby, the subset of output samples from each parallel path, represents a different polyphase component of a complete set of data samples. The ratio of the effective sampling rate (i.e., the full-rate associated with the complete set of data samples) to the parallel subsampling rate (i.e., the sub-rate associated with each parallel processing path) conventionally is referred to as the polyphase decomposition factor, and is generally equal to the number of parallel processing paths. More specifically, the operation of a processing function after polyphase decomposition by m is such that: 1) the data samples from the first parallel output correspond to the sub samples taken every $m^{th}$ (full-rate) sample-time period (i.e., subsampling by m), starting with the first sample (i.e., the outputs of the first parallel path are the even subsamples for m=2); and 2) the data samples from the $m^{th}$ parallel output correspond to the subsamples taken every $m^{th}$ (full-rate) sample-time period, starting with the $m^{th}$ sample (i.e., the output of the second parallel path are the odd subsamples for m=2). Because of discontinuities introduced by data sample repetition and deletion, rate-conversion (elastic) buffers do not operate as linear circuits. Therefore, conventional methods for multirate processing and polyphase decomposition cannot be applied directly to improve the operating rates of these buffers.

SUMMARY OF THE INVENTION

The present invention provides an improved polyphase (rate-conversion) buffer, which utilizes multirate (parallel)

processing to perform clock domain crossing (CDC) and rate-conversion for use, e.g., at very high sampling rates. Using multiple parallel paths, data samples that are received at one sampling rate, are periodically replicated (i.e., pulse/bit stuffing) or removed (i.e., pulse/bit deletion) from an input data stream, to produce an output data stream at a different sampling rate. Compared to a conventional elastic buffer, a polyphase (rate-conversion) buffer according to the preferred embodiments of the present invention can perform clock domain crossing at a higher effective sampling rate and is not limited by the maximum clocking rates of constituent components. Therefore, such a polyphase buffer can be particularly advantageous in digital signal processing applications, where due to computational complexity, multiple high-frequency clock domains are desired.

Thus, one specific embodiment of the invention is directed to an apparatus for converting a discrete-time input sequence at one sampling rate, into a discrete-time output sequence at a different sampling rate, comprising: 1) a plurality of input lines that accept in a parallel format, the multi-bit samples of an input signal which is sampled at an input rate; 2) a plurality of data storage (memory) banks, each having an input (write) port that is coupled to a particular input line, and also having one or more output (read) ports; 3) one or more block selection elements, each having one or more input ports that are coupled to the one or more output ports of the data storage banks, and also having an output port; 4) one or more bank selection elements, each having one or more input ports that are coupled to output ports of the block selection elements, and also having an output port; and 5) an array of output lines which are coupled to the output ports of the bank selection elements, and which provide in parallel format, the multi-bit samples of an output signal which is sampled at an output rate. Each input line is coupled to the input port of one of said storage banks, and each storage bank includes multiple memory (buffer) cells which: 1) store samples provided on the input port of the storage bank during multiple, sequential sampling intervals (i.e., samples from current and prior sampling intervals are written into memory); and 2) provide independent access to the stored data samples via the one or more output ports of the storage bank (i.e., samples from current and prior sampling intervals are read/retrieved from memory). Each of the block selection elements performs a first conventional multiplexing function, which based on a first configuration parameter, determines whether a particular output sample reflects a current or a prior sampling interval. Each of the bank selection elements performs a second conventional multiplexing function, which based on a second configuration parameter, determines which of the data storage banks provides a particular output sample. Through dynamic configuration of the block and bank selection elements, input samples are periodically repeated (stuffed) to increase the output sampling rate relative to the input sampling rate (e.g., repetition occurs when a particular memory cell is selected by two different block/bank selection elements), or are periodically skipped (deleted) to reduce the output sampling rate relative to the input sampling rate (e.g., deletion occurs when a particular memory cell is selected by none of the block/bank selection elements).

In variations of the above specific embodiment, the block selection element (i.e., first multiplexing function) and the bank selection element (i.e., second multiplexing function) are combined into a single, composite multiplexing function. In such an embodiment, a single array of multiplexers and a single configuration parameter select both a sampling interval (e.g., current or prior) and a data storage bank for sourcing a particular output sample. In certain other variations of the above specific embodiment, the configuration parameters for block and bank selection are generated internally by distinct circuits (e.g., block selection generators and/or bank selection generators), while in other variations, these configuration parameters are generated externally and provided as additional inputs to the apparatus. In still other variations of the above specific embodiment, the multiplexing functions are integrated with the data storage elements using conventional multi-port memories, which via a plurality of separate write/read ports, provide random (read) access to samples written from current and prior sampling intervals and/or samples written from various ones of the input lines.

A polyphase (rate-conversion) buffer created by incorporating one or more of the specific embodiments of the invention described above, can perform clock domain crossing and rate-conversion at higher effective sampling rates than are possible with conventional elastic buffers. Such a polyphase buffer can be used for various commercial, industrial and military applications, e.g., in various direct conversion transmitters, software-defined or cognitive radios, multi-channel communication transmitters, all-digital RADAR systems, and high-speed arbitrary waveform generators.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

DESCRIPTION OF THE PREFERRED EMBODIMENT(S)

The present inventor appreciates that the clock domain crossing and synchronization capability of conventional elastic buffers is limited by the maximum operating rates (i.e., the maximum clocking frequency) of the circuit components which comprise the buffering apparatus. Although modern digital signal processors use methods, such as parallel processing, to overcome limitations in the clocking rates of constituent components, these methods are directly applicable only to linear processing operations, and have not been adapted for use in non-linear systems where periodic replication or deletion of data samples is desired. Therefore, the present invention provides novel architectures for clock domain crossing and synchronization, which allow for the periodic replication or deletion of data samples at effective sampling rates that are higher than the maximum clocking rates of the constituent components.

Figure 1:
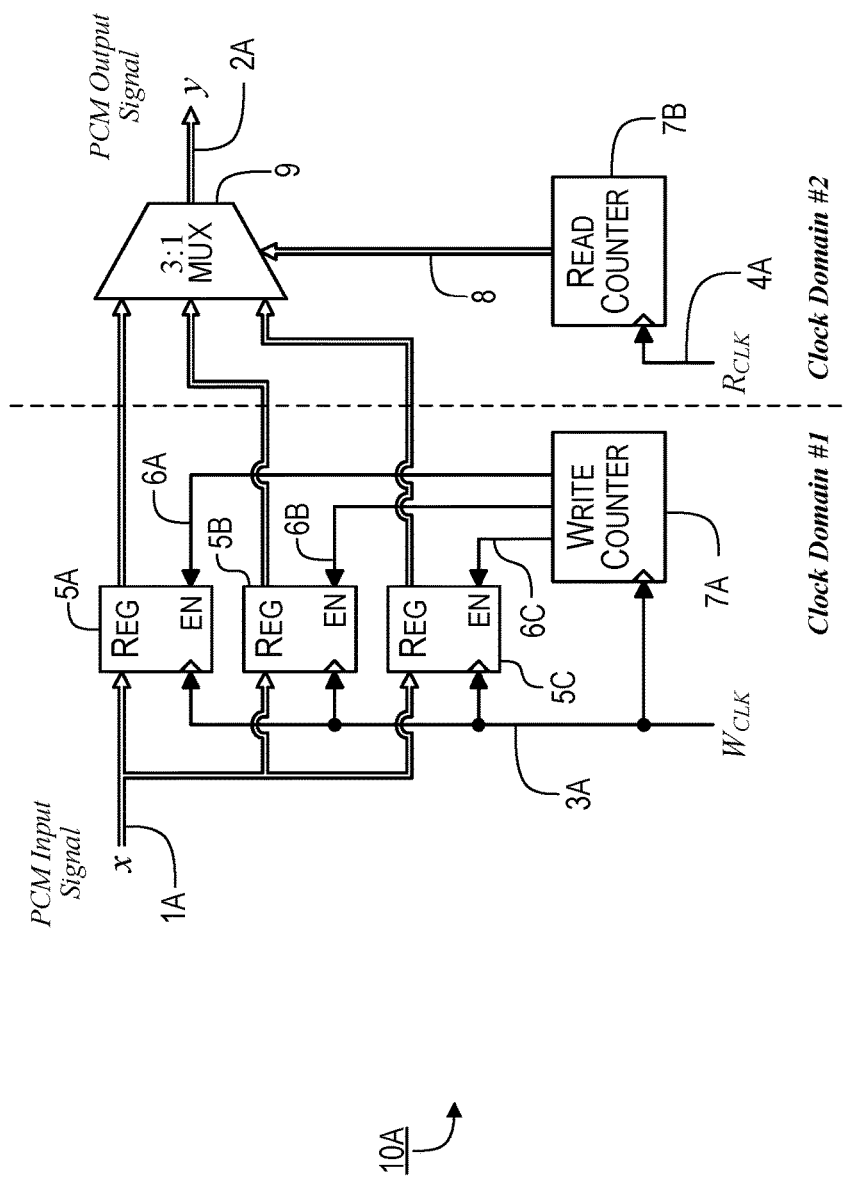
FIG. 1 is a block diagram of a conventional elastic buffer in which write and read operations take place at the same rate, and a write operation to a particular register occurs in advance of a read operation to the same register under the control of separate write and read counters.
Figure 2:
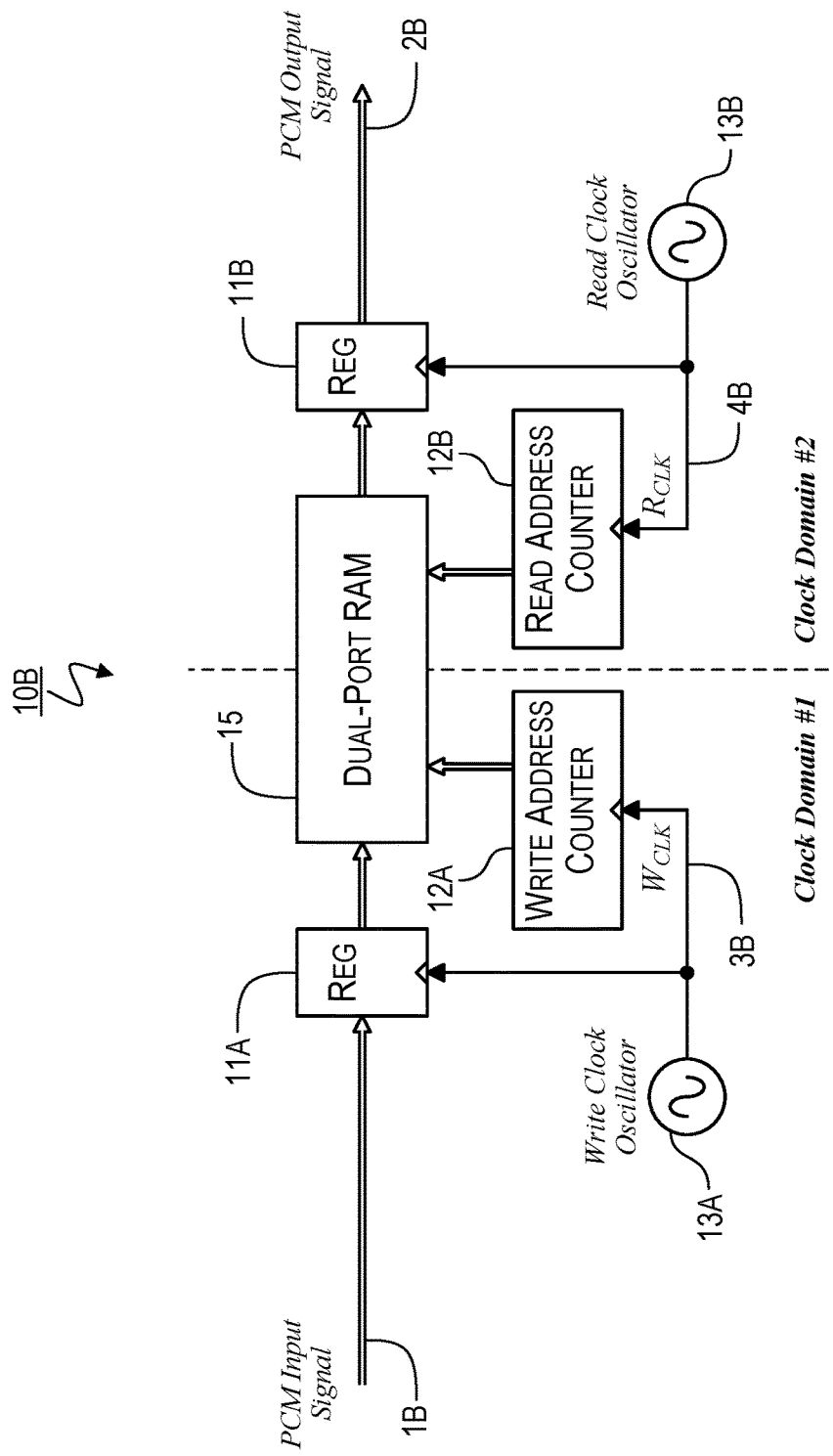
FIG. 2 is a block diagram of a conventional elastic buffer which utilizes a dual-port RAM to allow any register write operation to occur independently of any register read operation, under the control of separate write and read address counters.
Figure 3A:
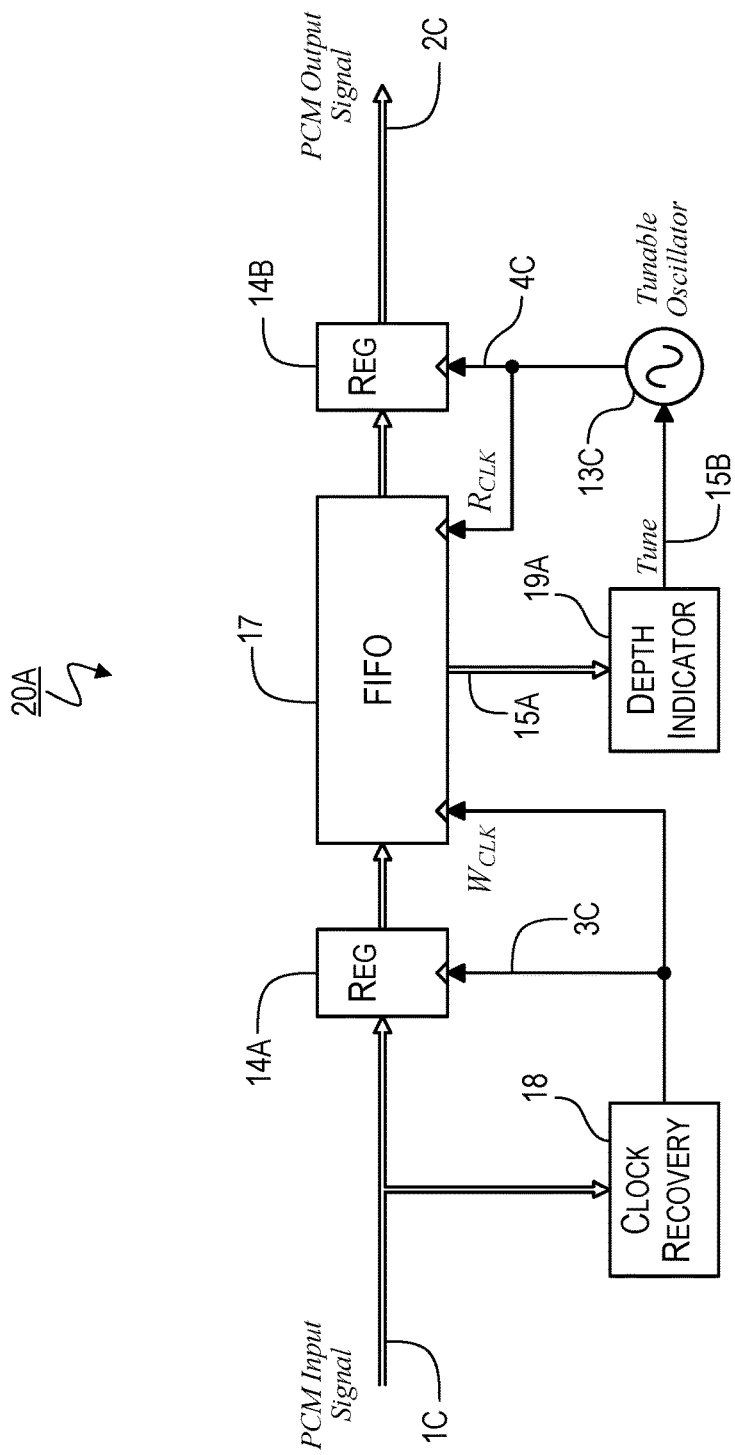
FIG. 3A is a block diagram of a conventional elastic buffer in which write and read operations take place at the same rate, and a write operation to a particular memory location occurs in advance of a read operation to the same memory location under the control of a tunable oscillator.
Figure 3B:
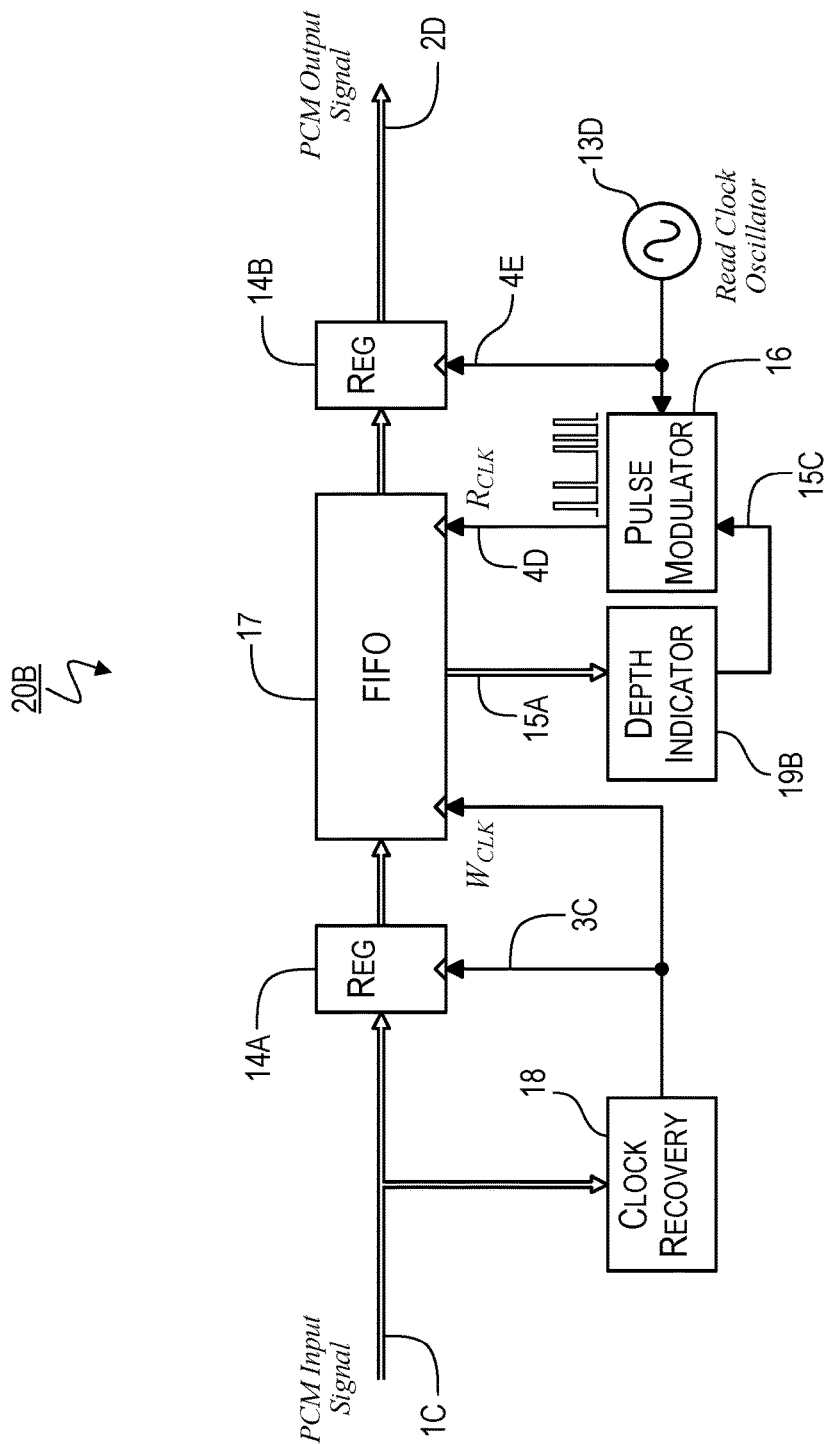
FIG. 3B is a block diagram of a conventional elastic buffer in which write and read operations occur independently, and a register write operation occurs in advance of a register read operation under the control of a clock pulse modulator.
Figure 4:
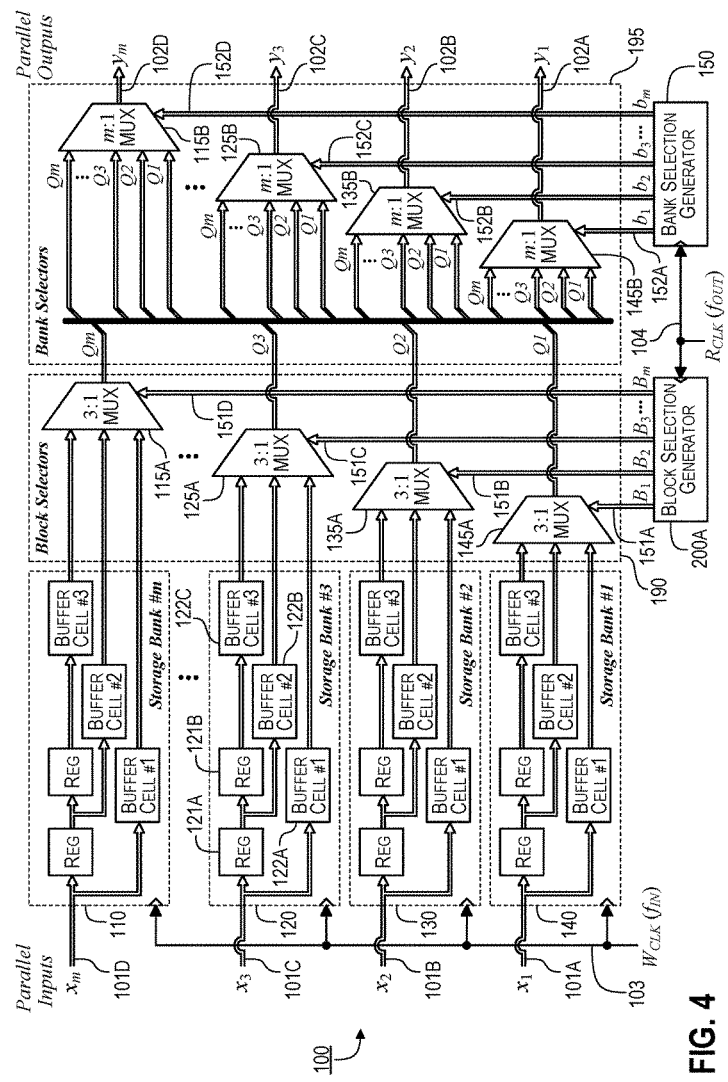
FIG. 4 is a block diagram of an exemplary implementation of a polyphase buffer, which utilizes multiple storage banks and multiplexers in a parallel processing arrangement that allows a register write operation to occur independently of a register read operation, under the control of separate bank selection and block selection elements.

A polyphase (rate-conversion) buffer that uses parallel processing to alter the effective sampling rate of a discrete-time input signal, is circuit 100 shown in FIG. 4. The exemplary circuit 100 illustrated in FIG. 4 receives m parallel inputs (e.g., inputs $x_i$ provided on lines 101A-D, with m=4 in the present embodiment, although in alternate embodiments m can have any other value) and produces m parallel outputs (e.g., outputs $y_i$ provided on lines 102A-D), such that the circuit operates with a polyphase decomposition factor of m. Parallel operation with a polyphase decomposition factor of m, allows signal processing to take place at an overall sampling rate (full-rate) of $f_S$, using circuits that operate at a subsampling rate (sub-rate) of $f_S'$, which is 1/m times lower (i.e., $f_S'=1/m \cdot f_S$). On write cycles occurring at subsampling intervals reflecting a sub-rate of $f_{IN}$, exemplary polyphase buffer 100 simultaneously transfers into m storage banks (e.g., storage banks 110, 120, 130 and 140), the m data samples that are received on m input lines (e.g., lines 101A-D). On read cycles occurring at subsampling intervals reflecting a sub-rate of $f_{OUT}$, which is potentially different from the sub-rate $f_{IN}$, exemplary polyphase buffer 100 also simultaneously transfers m data samples from the m storage banks, onto the m output lines (e.g., lines 102A-D). A set of conventional multiplexers (e.g., including m:1 multiplexers 115B, 125B, 135B, and 145B) performs a bank selection function to control which storage bank is coupled to one or more particular output line(s) for read access (i.e., via this first set of multiplexers, each of the m output lines can be coupled to any of the m storage banks). The values for bank selection (e.g., on lines 152A-D) determine for a given read cycle, which storage bank memory sources data samples to a particular output line or lines. Each of the m storage banks preferably includes multiple pipeline registers and multiple buffer cells, so that both current and prior data samples are accessible on any given read cycle. The buffer cells may be implemented as conventional elastic buffers, or other conventional data storage (e.g., memory) devices. In the exemplary embodiment of circuit 100, each storage bank includes two pipeline registers (e.g., registers 121A&B of storage bank 120) and three buffer cells (e.g., cells 122A-C of storage bank 120), such that via a block selection function performed by another set of conventional multiplexers (e.g., 3:1 multiplexers 115A, 125A, 135A, and 145A), read access is provided to input data samples from three different subsampling intervals. On a given read cycle, the values for block selection (e.g., on lines 151A-D) provide access to: 1) current data samples that have not been delayed by any subsampling interval (e.g., the sample within cell 122A); 2) prior data samples that have been delayed by one subsampling interval (e.g., the sample within cell 122B); and 3) prior data samples that have been delayed by two subsampling intervals (e.g., the sample within cell 122C). More generally, each storage bank includes n−1 pipeline registers and n buffer cells, and via an n:1 block selection function performed by conventional multiplexers, read access is provided to a current data sample and to n−1 prior data samples. As a consequence of bank selection and block selection, a current or prior data sample, which has been received during a write cycle on any of the m input lines, can be selected to appear on any of the m output lines during a corresponding read cycle.

Through appropriate control of bank and block selection within exemplary polyphase buffer 100, samples from an input data stream with sampling rate $f_{IN}$, are deleted or replicated periodically to produce an output data stream with sampling rate $f_{OUT}$. More specifically, the samples received on input lines 101A-D at one sampling rate, are replicated or deleted periodically to provide a sequence of samples on output lines 102A-D at a different sampling rate. Preferably, the input and output sampling rates are related according to a rate-conversion factor given by $$\frac{f_{IN}}{f_{OUT}} = \frac{N}{D},$$

where numerator N and denominator D are integers, such that the rate-conversion factor is a rational number. More specifically, the desired ratio of the input sampling rate $f_{IN}$ to the output sampling rate $f_{OUT}$, determines how often polyphase buffer 100 replicates or deletes samples from an input sequence x(0), x(1), x(2), x(3), . . . to produce an output sequence y(0), y(1), y(2), y(3), . . . . If the desired output rate equals or exceeds the input rate, such that N/D≤1, then polyphase buffer 100 preferably produces through periodic sample repetition (pulse stuffing), the output sequence given by $$y(k)=x(k+\lceil k \cdot (N/D-1) \rceil),$$

where the operator ⌈z⌉ denotes a ceiling function, and the index k represents a high-rate sampling interval (i.e., the sampling interval corresponding to the effective sampling rate of $f_S$). Accordingly, the output sequence of samples y(k) for a rate-conversion factor N/D≤1, is generated by replicating samples from the input sequence x(k), with an average periodicity of one sample for every |D/(D−N)| input samples. Alternatively, if the desired output rate is equal to or less than the input rate, such that N/D≥1, then polyphase buffer 100 preferably produces through periodic sample deletion (pulse deletion), the output sequence given by $$y(k)=x(k+\lfloor k\cdot(N/D-1) \rfloor),$$

where the operator $\lfloor z \rfloor$ denotes a floor function, and as before, the index k represents a high-rate sampling interval. Accordingly, the output sequence of samples y(k) for a rate-conversion factor N/D≥1, is generated by removing (deleting) samples in the input sequence x(0), x(1), x(2), x(3), . . . , with an average periodicity of one sample for every |D/(D−N)| input samples.

It should be noted that rather than receiving input samples and providing output samples at a high-rate (i.e., at a sampling rate of $f_S$), polyphase buffer 100 uses a parallel processing structure, where at a sub-rate of $1/m \cdot f_S$ (i.e., at a subsampling rate), m input samples are received simultaneously and m output samples are provided simultaneously. Therefore, an input sequence x(0), x(0, x(2), x(3), . . . is received as m separate (parallel) components $x_i$, and an output sequence y(0), y(1), y(2), y(3), . . . is provided as m separate (parallel) components $y_i$, such that $$x_i(j)=x(m\cdot(i-1)+j) \text{ and } y_i(j)=y(m\cdot(i-1)+j),$$

where the subscript i∈[1,m] and the index j represents a sub-rate (subsampling) interval. In the preferred embodiments, denominator D is an integer multiple of the polyphase decomposition factor m, such that D=K·m, for K an integer. However, in alternate embodiments, the denominator D is not an integer multiple of the polyphase decomposition factor m.

In the preferred embodiments, the values for bank selection (e.g., on lines 152A-D of exemplary buffer 100) are generated independently for each parallel output $y_i$ (e.g., outputs 102A-D of exemplary buffer 100). On the $j^{th}$ subsampling interval, the current value $b_i(j)$ for bank selection on the $i^{th}$ parallel output, preferably is generated by modulo-m addition of a bank-select increment $\Delta b_i$ and a prior value $b_i(j-1)$ for bank selection, according to the equation $$b_i(j) \begin{cases} b_i(0) & \text{if } j = 0 \\ b_i(j-1) \oplus \Delta b_i(j - D/m \cdot \lfloor j \cdot m/D \rfloor), & \text{if } j > 0 \end{cases},$$

where the ⊕ symbol denotes modulo-m addition (i.e., A⊕B=A+B−m·⌊(A+B)/m⌋), and m is the polyphase decomposition factor. The initial value $b_i(0)$ for bank selection is a function of the rate-conversion factor N/D, and is given by $$b_i(0) = \begin{cases} i + \lceil i \cdot (N/D - 1) \rceil, & \text{if } N/D \le 1 \\ i + \lfloor i \cdot (N/D - 1) \rfloor, & \text{if } N/D \ge 1 \end{cases}$$

(i.e., $b_i(0)$ is the initial condition for the $i^{th}$ bank selection generator). The bank-select increment $\Delta b_i$ varies, such that on each subsampling interval j, the bank-select increment $\Delta b_i$ cycles continuously through a finite-length sequence of integers. Preferably, the integers comprising this finite-length sequence differ by no more than one in value (i.e., $|\Delta b_i(j_1) - \Delta b_i(j_2)| \le 1$) and are given by $$\Delta b_i(j)=b_i(j+1)-b_i(j)|_{j=0,\ldots,n-1},$$

where n is the length of the sequence. In general, the set of bank-select increments associated with each parallel output, is a sequence of length n=D integers that sum to an amount which depends on the rate-conversion factor according to $$\sum_{j=0}^{D-1} \Delta b_i(j) = \begin{cases} m \cdot N, & \text{if } N/D \le 1 \\ m \cdot (N - D), & \text{if } N/D \ge 1 \end{cases}.$$

In the preferred embodiments, however, where denominator D is an integer multiple of the polyphase decomposition factor m, the set of bank-select increments associated with each parallel output, is a sequence of length n=D/m integers that sum to an amount which depends on the rate-conversion factor according to $$\sum_{j=0}^{D/m-1} \Delta b_i(j) = \begin{cases} N, & \text{if } N/D \le 1 \\ N - D, & \text{if } N/D \ge 1 \end{cases}.$$

Although a particular set of bank-select increments $\Delta b_i(0)$, $\Delta b_i(1)$, $\Delta b_i(2)$, . . . , $\Delta b_i(n-1)$ is specific to an $i^{th}$ parallel output, preferably the set of bank-select increments associated with any of the m parallel outputs is a cyclic permutation of a common base sequence. More specifically, each of the n elements comprising the $i^{th}$ set of bank-select increments maps to one of the n elements comprising the $(i+1)^{th}$ set of bank-select increments according to $\Delta b_i(j) \to \Delta b_{i+1}(j+\phi-n\cdot\lceil(j+\phi)/n\rceil)$, for a phase-shift constant $\phi\in[0,n-1]$.

Figure 5:
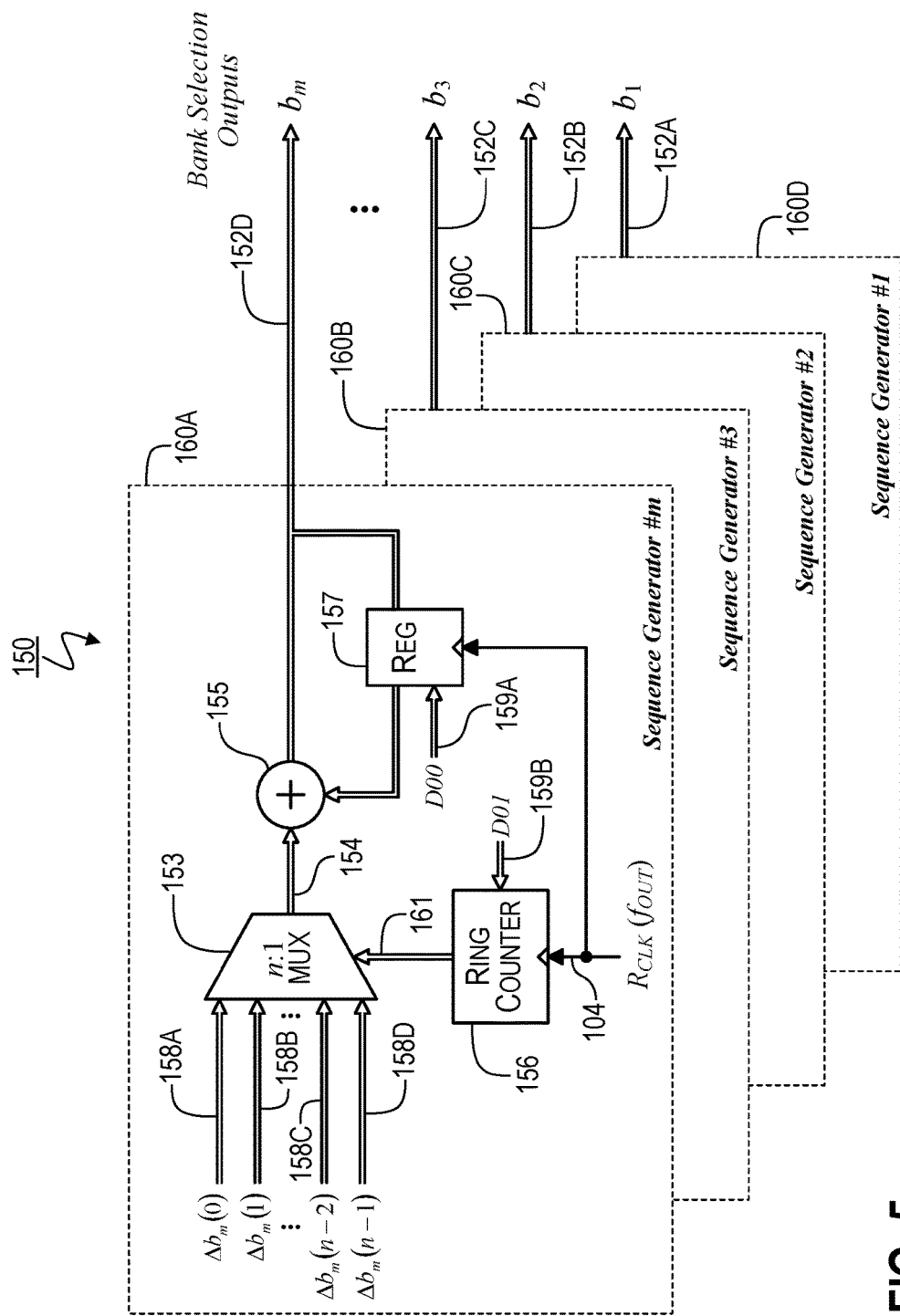
FIG. 5 is a block diagram of a bank selection generator, according to the preferred embodiments of the invention, which uses a number of independent sequence generators to produce a same number of bank selection outputs.

A bank selection generator according to the preferred embodiments of the invention, is circuit 150 shown in FIG. 5. As illustrated in FIG. 5, circuit 150 utilizes m distinct sequence generators (e.g., generators 160A-D), which preferably are identical in structure, to provide values for bank selection on each of the m parallel outputs of a polyphase buffer (e.g., outputs 102A-D of exemplary buffer 100 in FIG. 4). On subsampling intervals determined by clock 104 (i.e., on intervals reflecting a subsampling rate of $f_{OUT}$), generator 160 produces a current value for bank selection on the $m^{th}$ parallel output, via the modulo-m addition (e.g., within conventional adder 155) of: 1) the previous value for bank selection which has been stored within register 157; and 2) a variable (bank-select) increment which is provided on line 154, by n:1 multiplexer 153. In the preferred embodiments, register 157 is preset to an initial value for bank selection, which is provided on line 159A, and the value of the bank-select increment is determined by select line 161, under the control of conventional ring counter 156. Output 161 of ring counter 156, preferably causes conventional n:1 multiplexer 153 to select in a repeating sequential order, from the set of increments provided on its inputs (i.e., multiplexer 153 cycles though each of values 158A-D in a repeating, sequential order). The initial increment appearing on line 154 (i.e., the starting point of the increment cycle) preferably is established by presetting the state of ring counter 156, using a value provided on line 159B. In the preferred embodiments, the multiplexers in each of the m sequence generators, cycle through a common set of bank-select increments, but do not cycle through these common increments in the same order. Instead, the bank-select increments at the input of at least one multiplexer are ordered differently, or the initial state of at least one of the ring counters is preset differently, for example, such that the order through which these common increments cycle is not the same for all of the m sequence generators. As a result, the sequence of bank-select increments for all of the m parallel outputs, are various cyclic permutations of a common base sequence.

Although the operation of circuit 150 is not limited to a particular polyphase decomposition factor m, or to a particular rate-conversion factor N/D, general insight into the bank selection function is provided by considering a specific example. For a polyphase decomposition factor of m=8 and a rate-conversion factor of N/D=37/32, the preferred values $b_i(j)$ for bank selection can be obtained from the following table, which as derived from the equations given above, contains an initial value (condition) and set of bank-select increments for each of the m=8 parallel outputs (e.g., outputs 102A-D of exemplary buffer 100 in FIG. 4).

| Parallel Output i | Initial Value $b_i(0)$ | Set of Increments $[\Delta b_i(0), \Delta b_i(1), \Delta b_i(2), \ldots, \Delta b_i(n-1)]$ |
|---|---|---|
| 1 | 0 | [1, 1, 1, 2] |
| 2 | 1 | [1, 1, 2, 1] |
| 3 | 2 | [1, 1, 2, 1] |
| 4 | 3 | [1, 2, 1, 1] |
| 5 | 4 | [2, 1, 1, 1] |
| 6 | 5 | [2, 1, 1, 1] |
| 7 | 7 | [1, 1, 1, 2] |
| 8 | 0 | [1, 1, 2, 1] |

Referring to FIG. 5 and the table above, the initial value for bank selection on the $8^{th}$ parallel output, is preset to $b_8(0)=0$ (e.g., using line 159A of register 157), which causes the $8^{th}$ parallel output to be coupled to the first storage bank. On each subsampling interval, the previous value for bank selection (e.g., the value stored in register 157) is added to an increment that is cyclically and sequentially selected from the set [1, 1, 2, 1] (e.g., the set of increments provided to the inputs of 4:1 multiplexer 153 are sequentially coupled onto output line 154 under the control of ring counter 156). Consequently, the first 16 outputs (i.e., $b_8(0)$ to $b_8(15)$) of sequence generator 160A, which result from modulo-m addition (e.g., within adder 155) of the previous value for bank selection and the bank-select increment, are:

$b_8(0), b_8(1), b_8(2), \ldots, b_8(15) \Rightarrow$ 0, 1, 2, 4, 5, 6, 7, 1, 2, 3, 4, 6, 7, 0, 1, 3.

As a result of the above values for bank selection, the $8^{th}$ parallel output is coupled to the first storage bank on the first subsampling interval (i.e., j=0), the second storage bank on the second subsampling interval (i.e., j=1), and so on. Similarly, the sequence generator for the $7^{th}$ parallel output is preset to an initial value of $b_7(0)=7$ for bank selection (i.e., the output is initially coupled to the eighth storage bank), and the bank-select increments cycle in order through the values comprising the set [1, 1, 1, 2], such that the first 16 values for bank selection (i.e., $b_7(0)$ to $b_7(15)$) on the $7^{th}$ parallel output are:

$b_7(0), b_7(1), b_7(2), \ldots, b_7(15) \Rightarrow$ 7, 0, 1, 2, 4, 5, 6, 7, 1, 2, 3, 4, 6, 7, 0, 1.

By the same process, the first 16 values for bank selection (i.e., $b_i(0)$ to $b_i(15)$) on the remaining parallel outputs, are found to be:

$b_6(0), b_6(1), b_6(2), \ldots, b_6(15) \Rightarrow$ 5, 7, 0, 1, 2, 4, 5, 6, 7, 1, 2, 3, 4, 6, 7, 0

$b_5(0), b_5(1), b_5(2), \ldots, b_5(15) \Rightarrow$ 4, 6, 7, 0, 1, 3, 4, 5, 6, 0, 1, 2, 3, 5, 6, 7

$b_4(0), b_4(1), b_4(2), \ldots, b_4(15) \Rightarrow$ 3, 4, 6, 7, 0, 1, 3, 4, 5, 6, 0, 1, 2, 3, 5, 6

$b_3(0), b_3(1), b_3(2), \ldots, b_3(15) \Rightarrow$ 2, 3, 4, 6, 7, 0, 1, 3, 4, 5, 6, 0, 1, 2, 3, 5

$b_2(0), b_2(1), b_2(2), \ldots, b_2(15) \Rightarrow$ 1, 2, 3, 5, 6, 7, 0, 2, 3, 4, 5, 7, 0, 1, 2, 4

$b_1(0), b_1(1), b_1(2), \ldots, b_1(15) \Rightarrow$ 0, 1, 2, 3, 5, 6, 7, 0, 2, 3, 4, 5, 7, 0, 1, 2

Referring again to the table above, it can be seen that each set of bank-select increments exhibits the properties that are preferred for a rate-conversion factor of N/D≥1, since: 1) each set is a sequence comprising D/m=32/8=4 elements; 2) the individual elements of each set differ by no more than one in value (i.e., $|\Delta b_i(j_1) - \Delta b_i(j_2)| \leq 1$); 3) each set is a cyclic permutation of a common base sequence (e.g., the common base sequence [1, 1, 1, 2]); and 4) the individual elements of each set sum to an amount equaling $$\sum_{j=0}^{3} \Delta b_i(j) = N - D = 37 - 32 = 5.$$

By referring to the above example, those skilled in the art can determine the values for bank selection with other rate-conversion factors, including other rate conversion factors where N/D≤1.

It can be shown that the values $b_i(j)$ for bank selection are sequences that repeat every D subsampling intervals, where D is the denominator associated with the rate-conversion factor N/D. Those skilled in the art will, therefore, appreciate that certain conventional means for generating repeating sequences, including cyclic buffers and shift registers, can be utilized to produce the preferred values for bank selection. These conventional means for generating repeating sequences should be considered within the scope of the invention.

In the preferred embodiments, the values for bank selection are used to generate the values for block selection on each parallel output $y_i$ (e.g., outputs 102A-D of exemplary buffer 100 in FIG. 4). On the $j^{th}$ subsampling interval, the value $B_i(j)$ for block selection on the $i^{th}$ parallel output, preferably is generated from the values $b_i(j)$ for bank selection according to $$B_i(j) = \begin{cases} B_1(j), & \text{if } i = 1 \\ B_1(j) - \left(\sum_{k=1}^{i-1}(b_k(j) > b_{k+1}(j))\right), & \text{if } i \neq 1 \end{cases},$$

where $B_1(j)$ is the value for block selection on the first parallel output $y_1$. In the preferred embodiments of the invention, the rate-conversion factor N/D determines the method by which the value for block selection is calculated on the first parallel output, such that $$B_i(j) = \begin{cases} \sum_{k=1}^{m-1}(b_k(j) > b_{k+1}(j)), & \text{if } N/D \leq 1 \\ 1 + (\{j \cdot (N/D - 1)\} \leq \{(j-1) \cdot (N/D - 1)\}), & \text{if } N/D \geq 1 \end{cases},$$

where in the above equation, braces (curly brackets) are used to denote taking the fractional part of an argument (i.e., $\{x\} = x - \lceil x \rceil$). Those with skill in the art will appreciate that under certain limited operating conditions, simpler processing can be utilized to generate the values for block selection. In embodiments where the rate-conversion factor is never intended to exceed a value of one (i.e., N/D≯), for example, the following simpler calculation is used to generate the value for block selection:

$$B_i(j)=b_i(j)>b_m(j)$$

As indicated by the above equation, $B_m(j)=0$ for all j when N/D≯1.

Figure 6A:
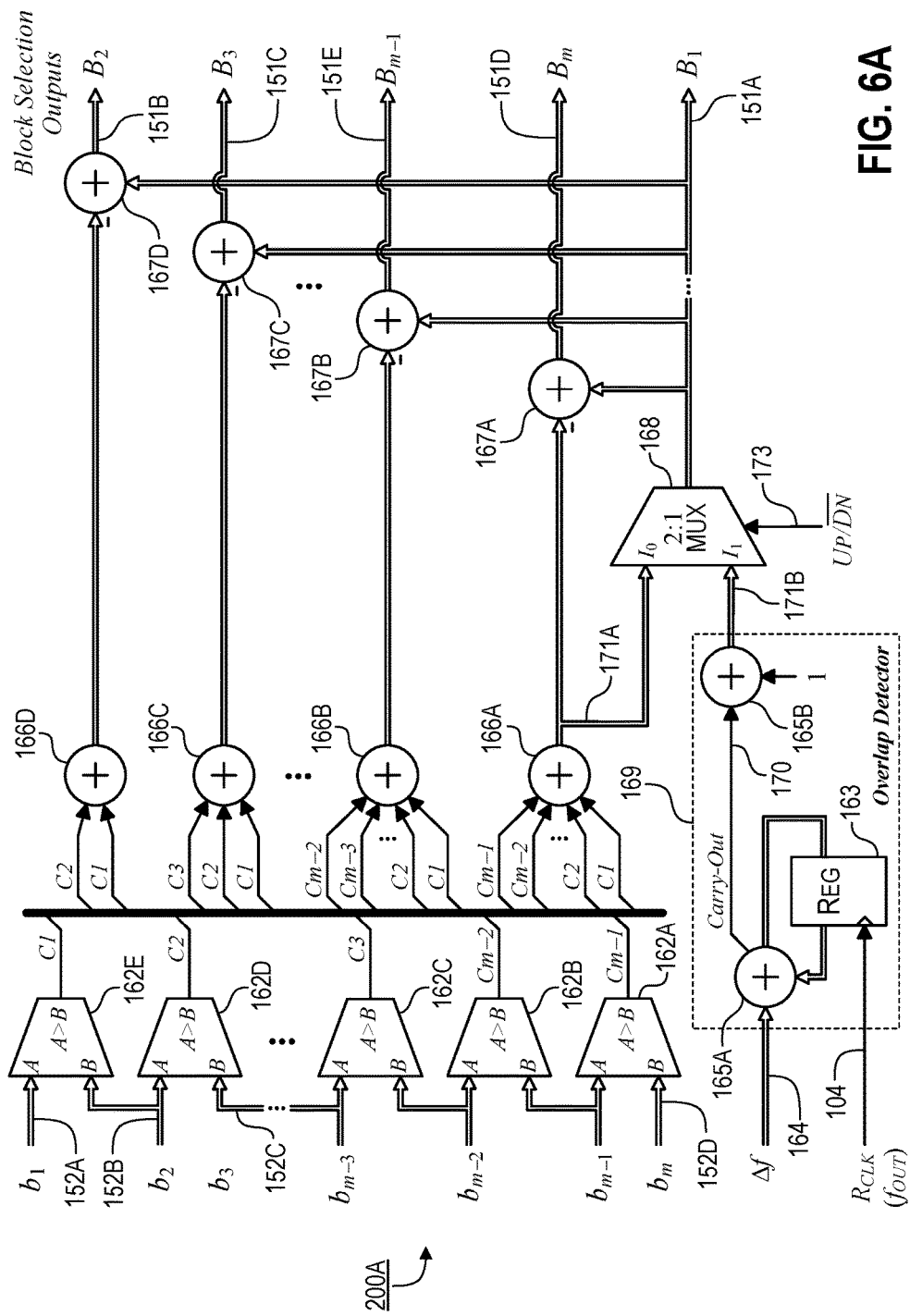
FIG. 6A is a block diagram of a block selection generator, according to the preferred embodiments of the invention, which produces a number of block selection outputs from a same number of bank selection inputs, and can be configured to operate in either a sample repetition or sample deletion mode.

A block selection generator according to the preferred embodiments of the invention, is circuit 200A shown in FIG. 6A. Generator 200A comprises an array of conventional comparators (e.g., comparators 162A-E), which preferably indicate by transitioning from an output value of zero (i.e., a false condition) to an output value of one (i.e., a true condition), when the value for bank selection (e.g., provided on input lines 152A-D) on the $i^{th}$ parallel output is greater than that on the $(i+1)^{th}$ parallel output. For each block select line (e.g., output lines 151A-E), one or more of the comparator outputs preferably are summed using a first array of adders (e.g., adders 166A-D), and then by subtracting a first adder output from the value $B_1(j)$ for block selection on the $1^{st}$ parallel output, a second array of adders (e.g., adders 167A-D) produces the values $B_i(j)$ for block selection on each of the m parallel outputs. In the preferred embodiments, a 2:1 multiplexer (e.g., multiplexer 168) is utilized to configure generator 200A for one of two modes of operation: 1) a mode in which the rate-conversion factor N/D≥1, and in which the value $B_1(j)$ for block selection on the $1^{st}$ parallel output, is provided by overlap detector 169 (e.g., provided by output 171B of adder 165B via select line 173); and 2) a mode in which the rate-conversion factor N/D≤1, and in which the value $B_1(j)$ for block selection on the $1^{st}$ parallel output, is provided by output 171A of adder 166A (e.g., via select line 173). Output 171B of overlap detector 169, preferably transitions from a value of one to a value of two, under a condition where the number of write operations occurring at a subsampling rate of $f_{IN}$, has exceeded the number of read operations occurring at a subsampling rate of $f_{OUT}$ (i.e., m input samples have been written into the storage bank array without a subsequent read). Such a condition means that the read operations must advance in time, via a sample deletion, in order to keep pace with the faster write operations. In the preferred embodiments, output 171B is produced by adding the value one (e.g., within adder 165B) to carry-out (overflow) output 170 of an adder (e.g., adder 165A) which accumulates the fractional frequency offset $\Delta f$, given by $$\Delta f = \frac{f_{IN}}{f_{OUT}} - 1 = \frac{N}{D} - 1.$$

Accumulation of fractional frequency offset $\Delta f$, preferably occurs at the output subsampling frequency of $f_{OUT}$. Those skilled in the art will readily appreciate that for a subsampling interval j, carry-out output 170 has a value $C_{OUT}(j)$ given by $$C_{OUT}(j)=1+(\{j\cdot(N/D-1)\}\le\{(j-1)\cdot(N/D-1)\}),$$

which equals the preferred value for $B_1(j)$ when N/D≥1 (and as before $\{x\}=x-\lceil x\rceil$).

Figure 6B:
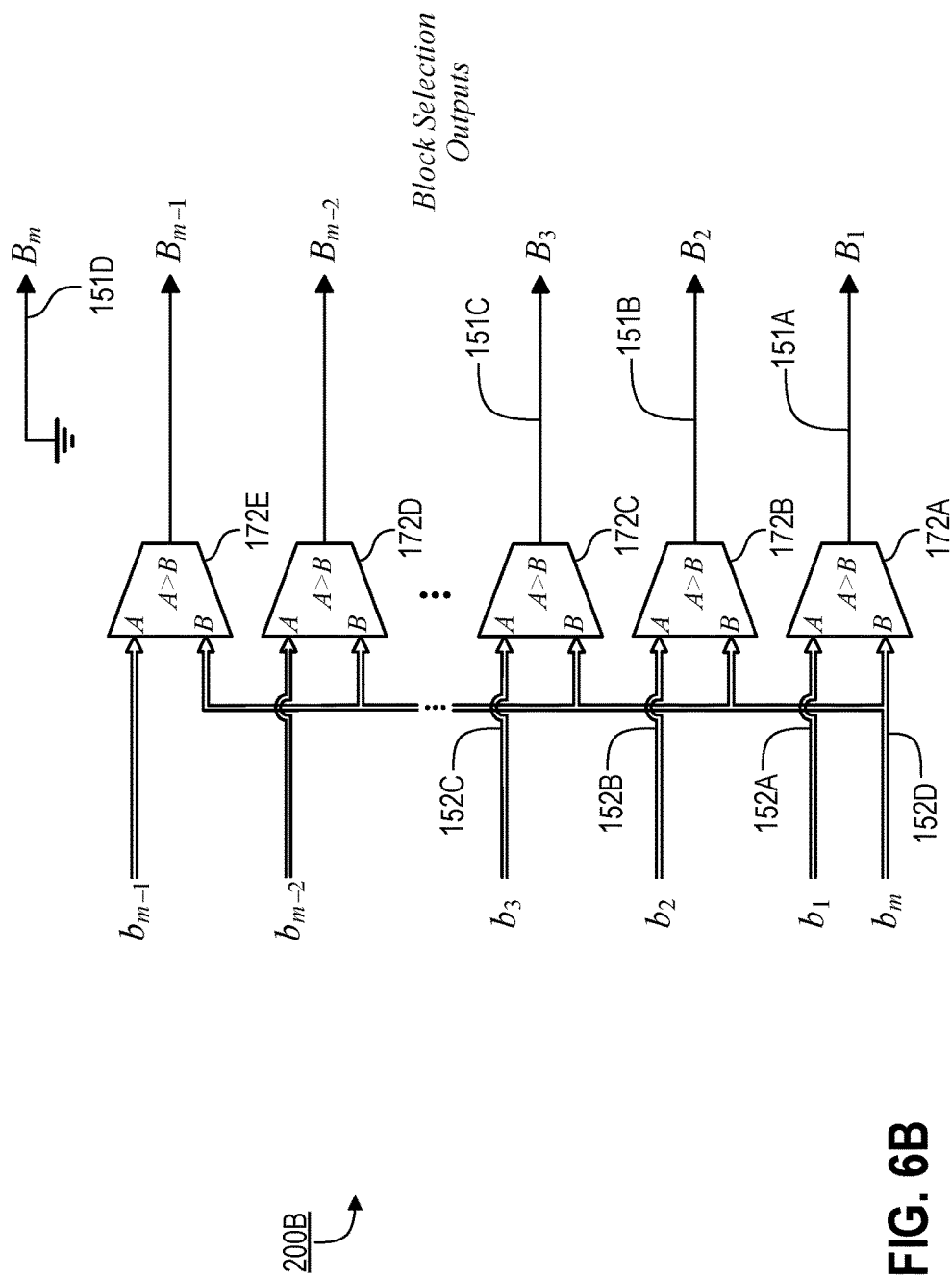
FIG. 6B is a block diagram of an alternate block selection generator, according to the preferred embodiments of the invention, which produces a number of block selection outputs from a same number of bank selection inputs, and is intended to operate in a sample repetition mode.

An alternate block selection generator is circuit 200B shown in FIG. 6B. Because of its lower complexity, circuit 200B is preferable to circuit 200A for block selection generation in embodiments where the rate-conversion factor N/D is not intended to exceed unity (i.e., N/D≯1). Generator 200B generates values for block selection (e.g., on outputs 151A-D) from a single array of conventional comparators (e.g., comparators 172A-E), which preferably indicate by transitioning from an output value of zero (i.e., a false condition) to an output value of one (i.e., a true condition), when the value for bank selection (e.g., from input lines 152A-D) on the $i^{th}$ parallel output is greater than that on the $m^{th}$ parallel output.

Like the operation of circuit 150 (FIG. 5) for generating the values for bank selection, the operation of circuit 200A for generating the values for block selection is not limited to a particular polyphase decomposition factor m, or to a particular rate-conversion factor N/D. However, some general insight into the operation of circuit 200A is provided by again considering a specific embodiment, such as that which employs a polyphase decomposition factor of m=8 and a rate-conversion factor of N/D=37/32. Since N/D≥1, multiplexer 168 is configured such that output 171B of overlap detector 169 provides the value for block selection on the $1^{st}$ parallel output (i.e., output 171B is coupled to output line 151A and provides block selection $B_1(j)$). As a result of accumulating the fractional frequency offset $\Delta f=37/32-1$ within adder 165A, the first 16 outputs (i.e., $B_1(0)$ to $B_1(15)$) on line 151A of generator 200A, are:

$B_1(0), B_1(1), B_1(2), \ldots, B_1(15) \Rightarrow$ 1, 1, 1, 1, 1, 1, 2, 1, 1, 1, 1, 1, 2, 1, 1, 1.

Therefore, the $1^{st}$ parallel output accesses input samples which are delayed by one subsampling period on subsampling intervals j=0, 1, ..., 5, 7, 8, ..., 11, 13, 14, and 15 (e.g., an input sample stored in buffer cell 122B of circuit 100 in FIG. 4), and accesses input samples which have been delayed by two subsampling periods on subsampling intervals j=6 and 12 (e.g., an input sample stored in buffer cell 122C of circuit 100 in FIG. 4). As demonstrated previously, the values for bank selection on the first 16 subsampling intervals of this specific embodiment, are given by:

$b_8(0), b_8(1), b_8(2), \ldots, b_8(15) \Rightarrow$ 0, 1, 2, 4, 5, 6, 7, 1, 2, 3, 4, 6, 7, 0, 1, 3.

$b_7(0), b_7(1), b_7(2), \ldots, b_7(15) \Rightarrow$ 7, 0, 1, 2, 4, 5, 6, 7, 1, 2, 3, 4, 6, 7, 0, 1.

$b_6(0), b_6(1), b_6(2), \ldots, b_6(15) \Rightarrow$ 5, 7, 0, 1, 2, 4, 5, 6, 7, 1, 2, 3, 4, 6, 7, 0

$b_5(0), b_5(1), b_5(2), \ldots, b_5(15) \Rightarrow$ 4, 6, 7, 0, 1, 3, 4, 5, 6, 0, 1, 2, 3, 5, 6, 7

$b_4(0), b_4(1), b_4(2), \ldots, b_4(15) \Rightarrow$ 3, 4, 6, 7, 0, 1, 3, 4, 5, 6, 0, 1, 2, 3, 5, 6

$b_3(0), b_3(1), b_3(2), \ldots, b_3(15) \Rightarrow$ 2, 3, 4, 6, 7, 0, 1, 3, 4, 5, 6, 0, 1, 2, 3, 5

$b_2(0), b_2(1), b_2(2), \ldots, b_2(15) \Rightarrow$ 1, 2, 3, 5, 6, 7, 0, 2, 3, 4, 5, 7, 0, 1, 2, 4

$b_1(0), b_1(1), b_1(2), \ldots, b_1(15) \Rightarrow$ 0, 1, 2, 3, 5, 6, 7, 0, 2, 3, 4, 5, 7, 0, 1, 2

Consequently, the first 16 values (i.e., $B_i(0)$ to $B_i(15)$) for block selection on the remaining parallel outputs are found, from the equation $$B_i(j) = B_1(j) - \left(\sum_{k=1}^{i-1}(b_k(j) > b_{k+1}(j))\right),$$

to be $B_2(0), B_2(1), B_2(2), \ldots, B_2(15) \Rightarrow$ 1, 1, 1, 1, 1, 1, 1, 1, 1, 1, 1, 1, 1, 1, 1, 1

$B_3(0), B_3(1), B_3(2), \ldots, B_3(15) \Rightarrow$ 1, 1, 1, 1, 1, 0, 1, 1, 1, 1, 1, 0, 1, 1, 1, 1

$B_4(0), B_4(1), B_4(2), \ldots, B_4(15) \Rightarrow$ 1, 1, 1, 1, 0, 0, 1, 1, 1, 0, 0, 0, 1, 1, 1, 1

$B_5(0), B_5(1), B_5(2), \ldots, B_5(15) \Rightarrow$ 1, 1, 1, 0, 0, 0, 1, 1, 1, 0, 0, 0, 1, 1, 1, 1

$B_6(0), B_6(1), B_6(2), \ldots, B_6(15) \Rightarrow$ 1, 1, 0, 0, 0, 0, 1, 1, 1, 0, 0, 0, 1, 1, 1, 0

$B_7(0), B_7(1), B_7(2), \ldots, B_7(15) \Rightarrow$ 1, 0, 0, 0, 0, 0, 1, 1, 0, 0, 0, 0, 1, 1, 0, 0

$B_8(0), B_8(1), B_8(2), \ldots, B_8(15) \Rightarrow$ 0, 0, 0, 0, 0, 0, 1, 0, 0, 0, 0, 0, 1, 0, 0, 0

To comply with the values for block selection in the above example, read access preferably is provided to input samples received on at least three different subsampling intervals. More specifically, read access is provided to: 1) current input samples that have not been delayed by any subsampling interval (i.e., $B_i(j)=0$); 2) prior input samples that have been delayed by one subsampling interval (i.e., $B_i(j)=1$); and 3) prior input samples that have been delayed by two subsampling intervals (i.e., $B_i(j)=2$). In the preferred embodiments, therefore, each storage bank (e.g., storage bank 120 of exemplary polyphase buffer 100), includes two pipeline registers (e.g., registers 121A&B) and three buffer cells (e.g., buffers 122A-C), so that on any given read cycle, accessibility is provided to data samples from three subsampling intervals (e.g., a current subsampling interval and two prior subsampling intervals).

By referring to the above example, those skilled in the art can determine the values for block selection with other rate-conversion factors, including other rate conversion factors where N/D≤1. Although not explicitly demonstrated herein, it can be shown that in embodiments where the rate-conversion factor is never intended to exceed a value of one (i.e., N/D≯1), such as where a block selection generator of the type illustrated by circuit 200B of FIG. 6B is utilized, compliance with the values for block selection entails providing read access to input samples received on only two different subsampling intervals. In such a case, read access is provided to: 1) current input samples that have not been delayed by any subsampling interval (i.e., $B_i(j)=0$); and 2) prior input samples that have been delayed by one subsampling interval (i.e., $B_i(j)=1$). It should be noted that other means can be utilized to compute values for block selection from values for bank selection, including conventional (memory-based) lookup tables, conventional digital-signal processors, and conventional microcontrollers. It further should be noted that the values $B_i(j)$ for block selection are sequences that repeat every D subsampling intervals, where D is the denominator associated with the rate-conversion factor N/D. Those skilled in the art will, therefore, recognize that certain conventional means for generating repeating sequences, including cyclic buffers and shift registers, can be utilized to produce the preferred values for block selection. These alternative means for block selection generation should be considered within the scope of the invention.

Additional Considerations.

As used herein, the term "coupled", or any other form of the word, is intended to mean either directly connected or connected through one or more other elements or processing blocks. In the drawings and/or the discussions of them, where individual steps, modules or processing blocks are shown and/or discussed as being directly connected to each other, such connections should be understood as couplings, which may include additional elements and/or processing blocks.

In the preceding discussion, the terms "operators", "operations", "functions" and similar terms refer to process steps or hardware components, depending upon the particular implementation/embodiment.

Unless clearly indicated to the contrary, words such as "optimal", "optimize", "maximize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing constraints.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for converting a discrete-time input sequence at one sampling rate, into a discrete-time output sequence at a different sampling rate, comprising:
   a plurality of multi-bit input lines for accepting, in a parallel format and at an input sampling rate, different multi-bit samples of an input signal;
   a plurality of data storage banks, each having an input that is coupled to one of said input lines, and also having plural outputs;
   a plurality of block selection elements, each having plural inputs that are coupled to outputs of said data storage banks and also having an output;
   a plurality of bank selection elements, each having plural inputs that are coupled to outputs of said block selection elements and also having an output; and
   a plurality of output lines coupled to the outputs said bank selection elements and providing, in parallel format and at an output sampling rate, the multi-bit samples of an output signal,
   wherein each of said data storage banks includes plural buffer cells which store samples received on current and prior intervals of the input sampling rate and provide independent access to said stored samples,
   wherein each of said block selection elements determines, according to a first configuration parameter, whether a particular output sample reflects a current or a prior interval of said input sampling rate, wherein each of said bank selection elements determines, according to a second configuration parameter, which of said data storage banks is coupled to which of said output lines, and wherein at least one of: (1) input samples are periodically repeated to increase said output sampling rate relative to said input sampling rate, or (2) input samples are periodically skipped to reduce said output sampling rate relative to the input sampling rate, based on dynamic configuration of the block and bank selection elements.

2. An apparatus according to claim 1, wherein each of said block selection elements and each of said bank selection elements is an independent functional component.

3. An apparatus according to claim 1, wherein at least two of said block selection elements are integrated into a single functional component.

4. An apparatus according to claim 1, wherein at least two of said bank selection elements are integrated into a single functional component.

5. An apparatus according to claim 1, wherein at least one block selection element and at least one bank selection element are integrated into a single functional component.

6. An apparatus according to claim 1, wherein the first configuration parameter for at least one block selection element is generated within said apparatus.

7. An apparatus according to claim 6, wherein the first configuration parameter for at least one block selection element is generated from the second configuration parameter for at least one bank selection element.

8. An apparatus according to claim 1, wherein the first configuration parameter for at least one block selection element is provided by an external input.

9. An apparatus according to claim 1, wherein the second configuration parameter for at least one bank selection element is generated within said apparatus.

10. An apparatus according to claim 1, wherein the second configuration parameter for at least one bank selection element is provided by an external input.

11. An apparatus according to claim 1, wherein the ratio of said input sampling rate to the ratio of said output sampling rate is a rational number.

12. An apparatus according to claim 11, wherein said ratio is a rational number that can be expressed with a denominator that is an integer multiple of a total number of said output lines.

13. An apparatus according to claim 1, wherein said data storage banks provide access to samples received on at least two prior intervals of said input sampling rate.

14. An apparatus according to claim 1, wherein said data storage banks provide access to samples received on at least three prior intervals of said input sampling rate.

15. An apparatus according to claim 1, wherein at least one of said data storage banks incorporates at least one buffer cell for inhibiting simultaneous write and read access to a same storage location.

16. An apparatus according to claim 15, wherein at least one of said at least one buffer cell is implemented as an elastic buffer.

17. An apparatus according to claim 15, wherein at least one of said at least one buffer cell is implemented as a first-in first-out memory.

* * * * *